United States Patent [19]

Amemiya et al.

[11] Patent Number: 4,551,676

[45] Date of Patent: Nov. 5, 1985

[54] PULSE CODER USING MAGNETORESISTANCE ELEMENTS HAVING AN IMPROVED Z-PHASE SIGNAL PATTERN

[75] Inventors: Yoichi Amemiya, Hachioji; Hiroshi Ishida, Hamuramachi; Yashitaka Takekoshi; Shigeyuki Ushiyama, both of Hino, all of Japan

[73] Assignee: Fanuc Ltd, Tokyo, Japan

[21] Appl. No.: 448,206

[22] Filed: Dec. 9, 1982

[30] Foreign Application Priority Data

Mar. 2, 1982 [JP] Japan .................... 57-31687

[51] Int. Cl.⁴ .............. G01B 7/14; G01P 3/42; G08C 21/00
[52] U.S. Cl. ................... 324/208; 324/174; 340/870.32
[58] Field of Search ........... 324/207, 208, 167, 168, 324/173, 174, 235, 252, 234, 233, 232, 239, 251; 340/870.31, 870.32, 364, 357, 345

[56] References Cited

U.S. PATENT DOCUMENTS

| | | | |
|---|---|---|---|
| 3,185,920 | 5/1965 | Brunner | 324/208 X |
| 3,993,946 | 11/1976 | Makino | 324/208 |
| 4,274,053 | 6/1981 | Ito et al. | 324/208 X |
| 4,305,072 | 12/1981 | Makita | 324/208 X |
| 4,319,188 | 3/1982 | Ito et al. | 324/208 X |

FOREIGN PATENT DOCUMENTS

| | | | |
|---|---|---|---|
| 2442919 | 3/1976 | Fed. Rep. of Germany | 324/208 |
| 0156656 | 12/1979 | Japan | 324/208 |
| 56-87862 | 7/1981 | Japan . | |
| 1472258 | 5/1977 | United Kingdom | 324/208 |
| 2065310 | 6/1981 | United Kingdom | 324/208 |

*Primary Examiner*—Gerard R. Strecker
*Assistant Examiner*—Warren S. Edmonds
*Attorney, Agent, or Firm*—Armstrong, Nikaido, Marmelstein and Kubovcik

[57] ABSTRACT

A pulse coder comprises a rotating member (1) on which first and second magnetic patterns (221, 222; 221', 222') are formed and a fixed member (3) on which first and second magnetoresistance patterns (MR5, MR6) are formed. When the first and second magnetic patterns of the rotating member directly face the first and second magnetoresistance patterns, respectively, of the fixed member, the first and second magnetoresistance patterns have a minimum resistance value and a maximum resistance value, respectively. The first and second magnetic patterns are constructed by alternately and irregularly arranging strong magnetic field generating areas and weak magnetic field generating areas.

6 Claims, 18 Drawing Figures

PRIOR ART

ROTATIONAL ANGLE

PULSE CODER USING MAGNETORESISTANCE ELEMENTS HAVING AN IMPROVED Z-PHASE SIGNAL PATTERN

BACKGROUND OF THE INVENTION

1. Field of the Invention

The present invention relates to a pulse coder using magnetoresistance (reluctance) elements or magnetic sensors, more particularly, to the improvement of magnetic patterns for detecting a rotational reference position.

2. Description of the Prior Art

In recent years, pulse coders using magnetoresistance elements have been developed in order to detect the rotational angle of a servo motor or the like. Such pulse coders are not significantly affected by dirt and, accordingly, offer greater reliability than pulse coders using optical systems.

A prior art pulse coder using magnetoresistance elements comprises a rotating member, such as a magnetic disk, on which magnetic patterns are formed and a fixed member on which magnetoresistance patterns are formed. The magnetoresistance patterns convert the magnetic flux from the magnetic patterns into an electrical signal. Such magnetic patterns may be roughly classified into A-phase patterns for generating an A-phase signal; B-phase patterns for generating a B-phase signal; and Z-phase patterns for generating a Z-phase signal. The A-phase signal and the B-phase signal are used for detecting the rotational angle of the rotating member, while the Z-phase signal is used for detecting the reference position of the rotating member.

The present invention relates to an improvement of a Z-phase magnetic pattern.

Such a Z-phase magnetic pattern is constructed by alternately and regularly (equidistantly) arranging strong magnetic field generating areas and weak magnetic field generating areas on part of a circumference of the rotating member. The magnetoresistance pattern on the fixed member has first and second magnetoresistance elements which are electrically connected. In this case, when the first magnetoresistance element directly faces the strong magnetic field areas, the second magnetoresistance element directly faces to the weak magnetic field areas. As a result, the output voltage obtained at the connection between the first and second magnetoresistance elements reaches a maximum peak. The reference position of the rotating member can be determined by detecting such a maximum peak.

In the above-mentioned prior art, however, other peaks of output voltage are generated at the magnetoresistance element connection every cycle of the strong magnetic field generating areas and the weak magnetic field generating areas even when the detected position of the rotating member is off from the maximum peak point. In addition, the differences between the maximum peak and the other peaks are not that large. As a result, it is difficult to distinguish the maximum peak from the other peaks, causing errors of detection of the reference position of the rotating member.

SUMMARY OF THE INVENTION

It is, therefore, an object of the present invention to provide a pulse coder in which no error of detection of the reference position of the rotating member is generated.

According to the present invention, the strong magnetic field generating areas and the weak magnetic field generating areas of the rotating member are arranged alternately and irregularly. This enables the differences between the maximum peak and the other peaks to be enlarged, therefore, making it easy to distinguish the maximum peak from the other peaks and to prevent errors of detection of the reference position of the rotating member.

The present invention will be more clearly understood from the description as set forth below contrasting the present invention with the prior art and referring to the accompanying drawings.

DESCRIPTION OF THE PREFERRED EMBODIMENTS

Figure 1:
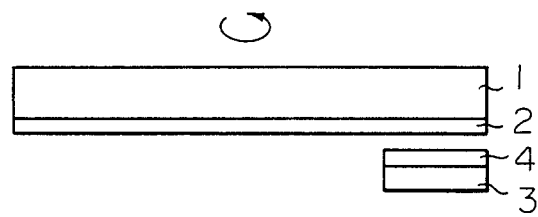
FIG. 1 is a schematic diagram illustrating a prior art pulse coder using magnetoresistance elements.

In FIG. 1, reference numeral 1 designates a rotating member on which a magnetic layer 2 is coated. Predetermined magnetic patterns, which will be explained later, are formed on the magnetic layer 2. Reference numeral 3 designates a fixed member on which predetermined magnetoresistance patterns 4, which will also be explained later, are formed.

It should be noted that the resistance value of a magnetoresistance element is decreased under the influence of magnetic flux regardless of whether the pole area is N or S.

Figure 2:
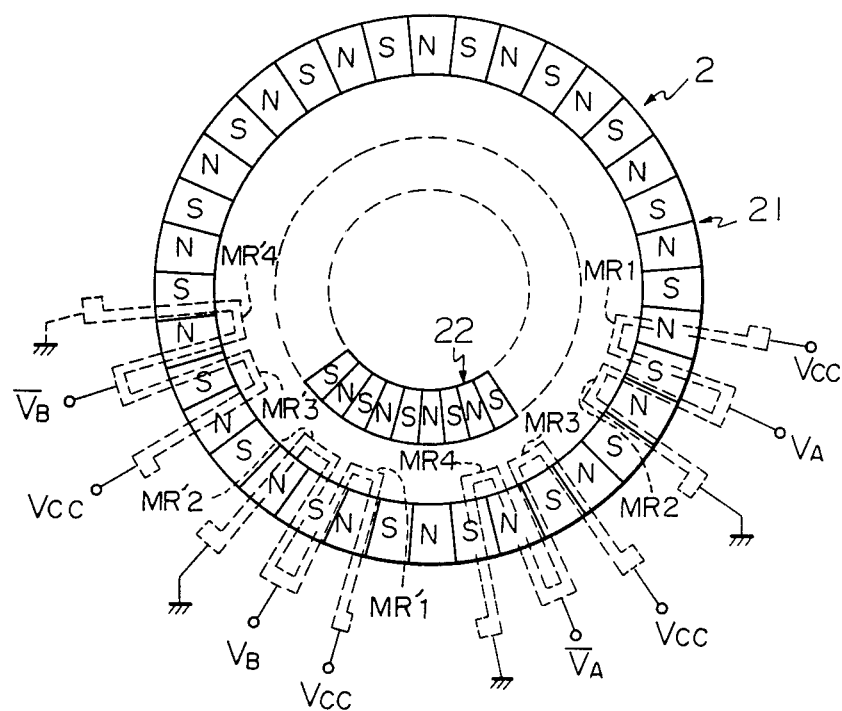
FIG. 2 is a diagram of the magnetic pattern and the magnetoresistance patterns of FIG. 1, for an A-phase signal and a B-phase signal.

In FIG. 2, N pole areas and S pole areas are alternately and regularly (equidistantly) arranged on the magnetic layer 2, so as to form two magnetic patterns 21 and 22. In this case, a strong magnetic field is generated immediately above the N pole areas or the S pole areas. Accordingly, the N pole areas or the S pole areas serve as strong magnetic field generating areas. Therefore, when a magnetoresistance element directly faces the N pole areas or the S pole areas, the resistance value of the element becomes small. On the other hand, the radial boundary areas between the N pole areas and the S pole areas serve as weak magnetic field generating areas. Therefore, when a magnetoresistance element directly faces the radial boundary areas, the resistance value of the element becomes large.

The magnetic pattern 21 for generating an A-phase signal and a B-phase signal is formed on the entire circumference of the rotating member 1, while the magnetic pattern 22 for generating a Z-phase signal is formed on only part of a circumference of the rotating member 1. The magnetic pattern 22 will be later explained with reference to FIGS. 5A and 5B.

An A-phase signal generating magnetoresistance pattern is constructed on the fixed element 3 (FIG. 2) by elements MR1 through MR4, and a B-phase signal generating magnetoresistance pattern is constructed on the fixed element 3 (FIG. 3) by magnetoresistance elements MR1' through MR4'. Assuming that the length of one N pole area or S pole area is one wavelength $\lambda$ ($=360°$), the difference in phase between the magnetoresistance element MR1 and the magnetoresistance element MR2 and between the magnetoresistance element MR3 and MR4 is $\lambda/2$. In addition, the difference in phase between all the magnetoresistance elements MR1 and MR2 and all the magnetoresistance elements MR3 and MR4 is $\lambda/2$. the magnetoresistance elements MR1' through MR4' are the same in construction as the magnetoresistance elements MR1 through MR4. In this case, the difference in phase between all the magnetoresistance elements MR1 through MR4 and all the magnetoresistance elements MR1' through MR4' is $\lambda/4$. Note that $V_{CC}$ represents a power supply voltage.

Figure 3A:
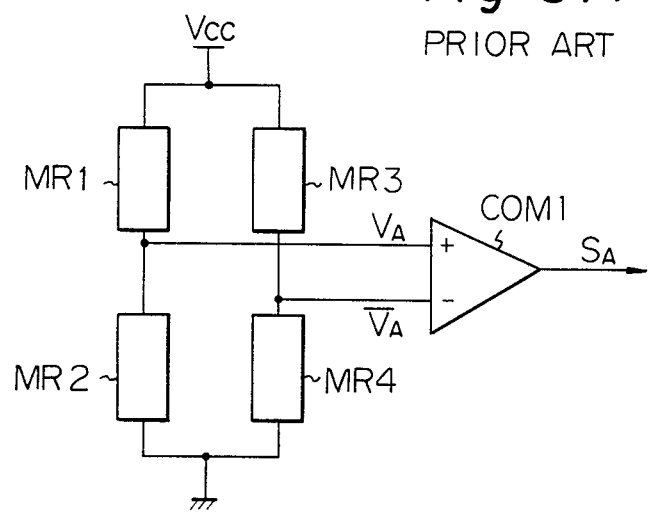
FIG. 3A is a circuit diagram illustrating a prior art A-phase signal generating circuit.
Figure 3B:
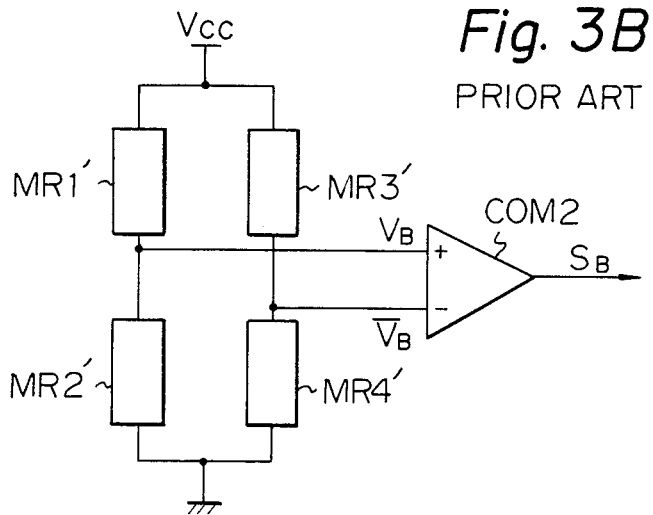
FIG. 3B is a circuit diagram illustrating a prior art B-phase signal generating circuit.

An A-phase signal generating circuit and a B-phase signal generating circuit will now be explained with reference to FIGS. 3A and 3B. In FIG. 3A, a comparator COM1 is provided to compare the voltage $V_A$ at the connection between the magnetoresistance elements MR1 and MR2 with the voltage $\overline{V}_A$ at the connection between the magnetoresistance elements MR3 and MR4, so as to generate an A-phase signal $S_A$. Similarly, in FIG. 3B, a comparator COM2 is provided to compare the voltage $V_B$ at the connection between the magnetoresistance elements MR1' and MR2' with the voltage $\overline{V}_B$ at the connection between the magnetoresistance elements MR3' and MR4', so as to generate a B-phase signal $S_B$.

Figure 4A:
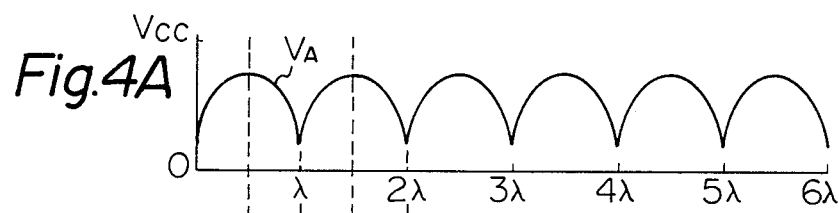
FIGS. 4A through 4F are timing diagrams of the signals appearing in the circuits of FIGS. 3A and 3B.
Figure 4B:
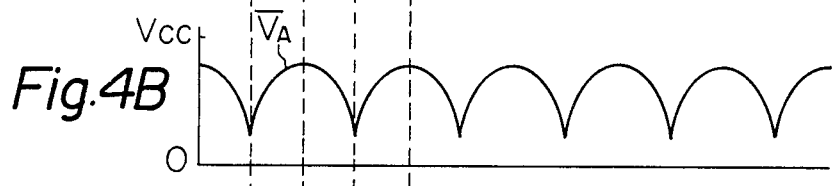
Figure 4C:
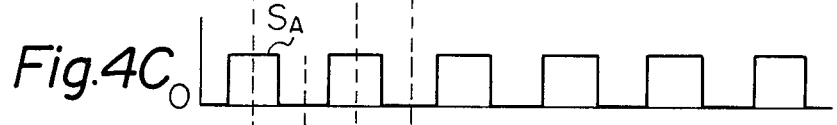
Figure 4D:
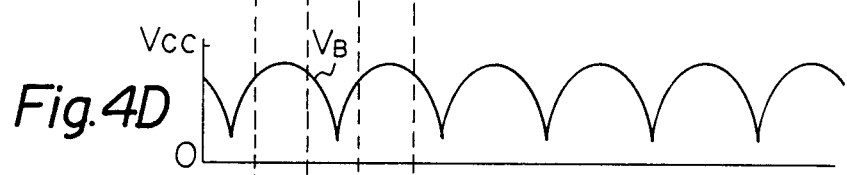
Figure 4E:
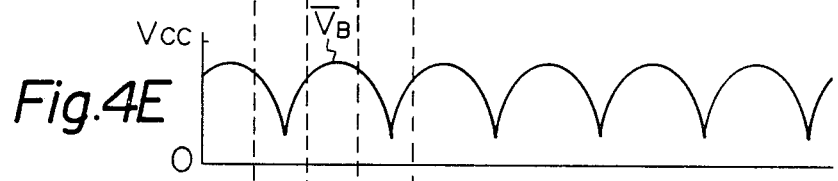
Figure 4F:
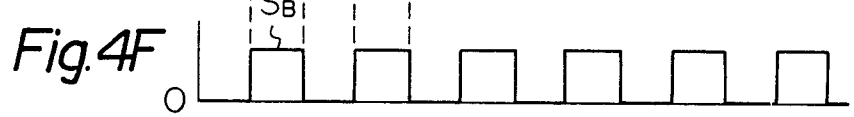

When the rotating member 1 (FIG. 1) rotates, the voltage $V_A$ and the voltage $\overline{V}_A$ change as shown in FIGS. 4A and 4B. Accordingly, the A-phase signal $S_A$ changes as shown in FIG. 4C. Similarly, the voltage $V_B$ and the voltage $\overline{V}_B$ change as shown in FIGS. 4D and 4E. Accordingly, the B-phase signal $S_B$ changes as shown in FIG. 4F. That is, the difference in phase between the A-phase signal $S_A$ and the B-phase signal $S_B$ is $\lambda/4$. Therefore, supply of the signals $S_A$ and $S_B$ to a phase discriminating circuit, up/down counter, and so on enables the detection of the rotational angle of the rotating member 1.

Figure 5A:
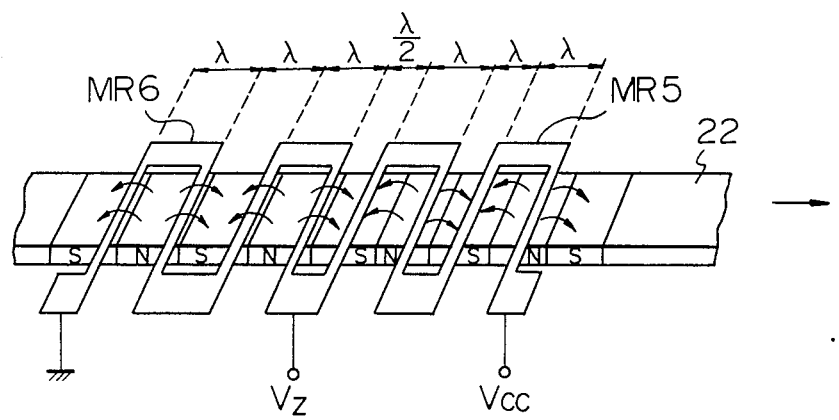
FIGS. 5A and 5B are diagrams illustrating the magnetic pattern and the magnetoresistance pattern of FIG. 1, for a Z-phase signal.

A Z-phase signal generating magnetoresistance pattern will now be explained with reference to FIGS. 5A and 5B. The Z-phase signal generating magnetoresistance pattern is constructed by magnetoresistance elements MR5 and MR6. In this case, the difference in phase between the magnetoresistance elements MR5 and MR6 is $\lambda/2$. Therefore, as illustrated in FIG. 5A, when the magnetoresistance element MR5 directly faces strong magnetic field generating areas formed by the N pole areas or the S pole areas, the magnetoresistance element MR6 directly faces weak magnetic field generating areas formed by the radial boundary areas between the N pole areas and S pole areas. As a result, the resistance value of the magnetoresistance element MR5 is at a minimum, while the resistance value of the magnetoresistance element MR6 is at a maximum. In this case, therefore, the voltage $V_Z$ at the connection between the magnetoresistance elements MR5 and MR6 reaches a maximum peak.

Figure 5B:
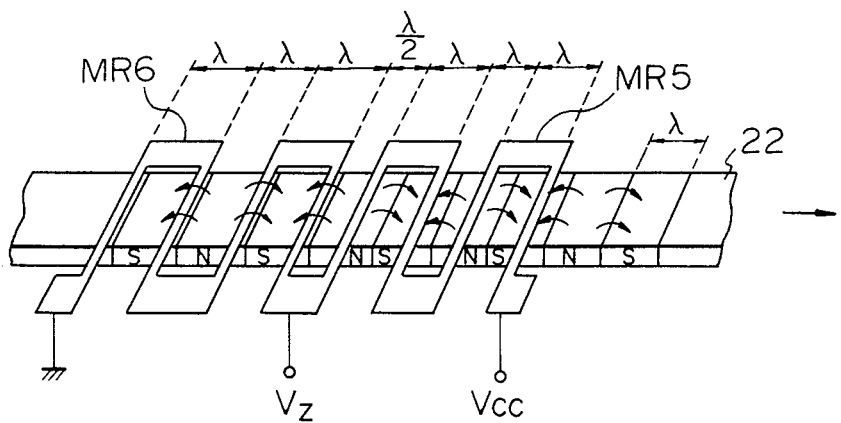
Figure 6:
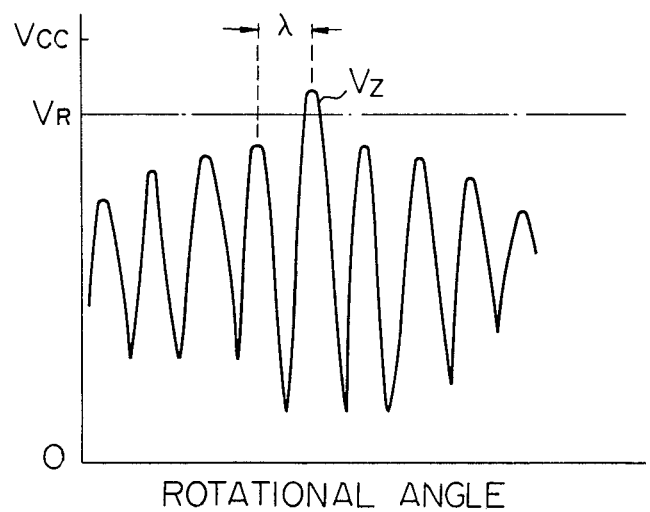
FIG. 6 is a graph showing the relationship between the rotational angle of the rotating member and the output voltage $V_Z$ of FIGS. 5A and 5B.

However, as illustrated in FIG. 5B, even when the rotating member 1 (FIG. 1) rotates to move the magnetic pattern 22 for one wavelength ($\lambda$), the magnetoresistance element MR5 directly faces strong magnetic field generating areas formed by the N pole areas and the S pole areas and, simultaneously, the magnetoresistance element MR6 directly faces weak magnetic field generating areas formed by the radial boundary areas between the N pole areas and the S pole areas. In this case, therefore, the voltage $V_Z$ also reaches a peak. That is, as shown in FIG. 6, other peaks smaller than the maximum peak appear in every cycle ($\lambda$). In addition, the differences between the maximum peak and the other peaks are small. Accordingly, the margin of a reference level $V_R$ for discriminating the maximum peak from the other peaks is also small.

Figure 7:
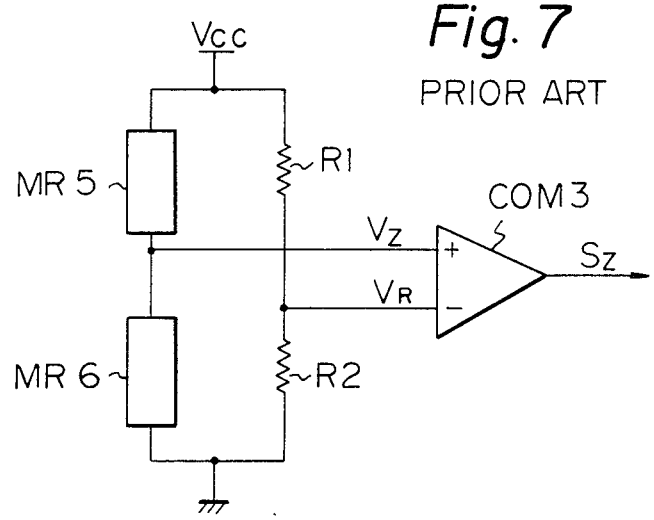
FIG. 7 is a circuit diagram illustrating a prior art Z-phase signal generating circuit.

A Z-phase signal generating circuit will now be explained with reference to FIG. 7. In FIG. 7, a comparator COM3 is provided to compare the voltage $V_Z$ at the connection between the magnetoresistance elements MR5 and MR6 with the reference level $V_R$ at the connection between resistors R1 and R2, so as to generate a Z-phase signal $S_Z$. In this case, since the margin of the reference level $V_R$ is small as shown in FIG. 6, when the voltage $V_Z$ fluctuates due to the relative change of the magnetoresistance elements MR5 and MR6 to the magnetic pattern 22 (FIGS. 5A and 5B) or when the ratio of resistance value of the resistor R1 to the resistor R2 fluctuates due to temperature changes or the like, the comparator COM3 may detect peaks other than the maximum peak, thus causing errors of detection of the reference position of the rotating member 1 (FIG. 1).

According to the present invention, the differences between the maximum peak and the other peaks are enlarged, thus enlarging the margin of the reference level $V_R$.

Figure 8:
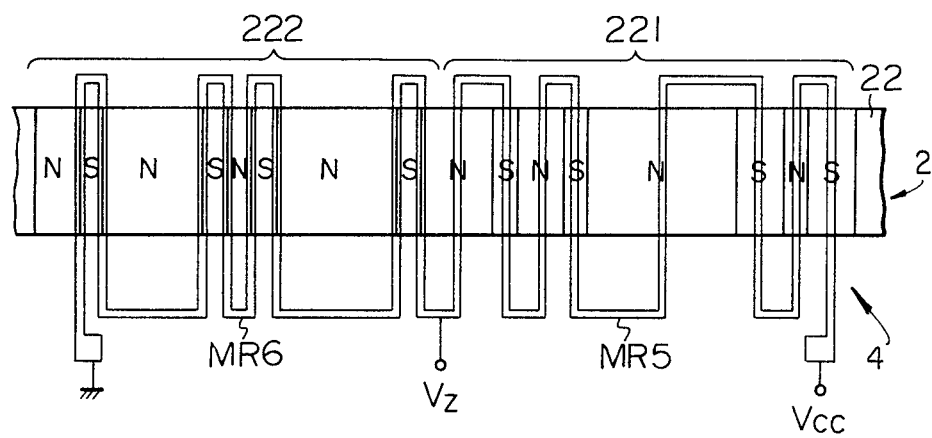
FIG. 8 is a diagram illustrating a first embodiment of the magnetic pattern and the magnetoresistance patterns for a Z-phase signal, according to the present invention.

In FIG. 8, which illustrates a first embodiment of the present invention, the magnetic pattern 22 is constructed by a first pattern 221 and a second pattern 222 in which N pole areas and S pole areas are arranged alternately and irregularly, that is, the interval of the N- and S- pole areas is not uniform, and the width of at least one of the areas is different from the width of another. In this case, the N pole areas and S pole areas serve as strong magnetic generating areas, and the radial boundary areas between the N pole areas and the S pole areas serve as weak magnetic generating areas.

The magnetoresistance elements MR5 and MR6 correspond to the first and second magnetic patterns 221 and 222, respectively. In addition, when the magnetoresistance element MR5 directly faces the strong magnetic field generating areas, the magnetoresistance element MR6 directly faces the weak magnetic field generating areas. As a result, the magnetoresistance element MR5 has a minimum resistance value and the magnetoresistance element MR6 has a maximum resistance value. Therefore, the output voltage $V_Z$ reaches a maximum peak.

Figure 9:
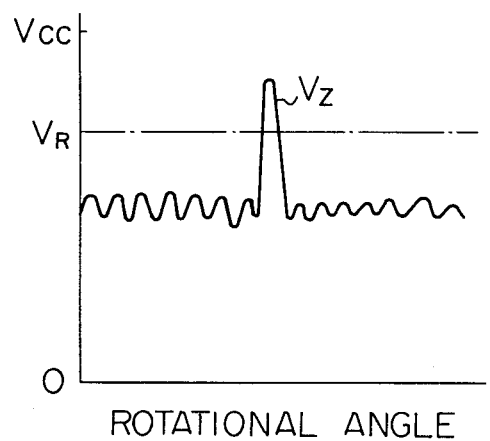
FIG. 9 is a graph showing the relationship between the rotational angle of the rotating member and the output voltage $V_Z$ of FIG. 8.

When the rotating member 1 (FIG. 1) rotates to move the magnetic pattern 22, other peaks than the maximum peak are also generated as shown in FIG. 9. The levels of such other peaks are, however, very small as compared with the level of the maximum peak. This is due to the irregular arrangement of the magnetic patterns 221 and 222. Therefore, the margin of the reference level $V_R$ is large.

Figure 10:
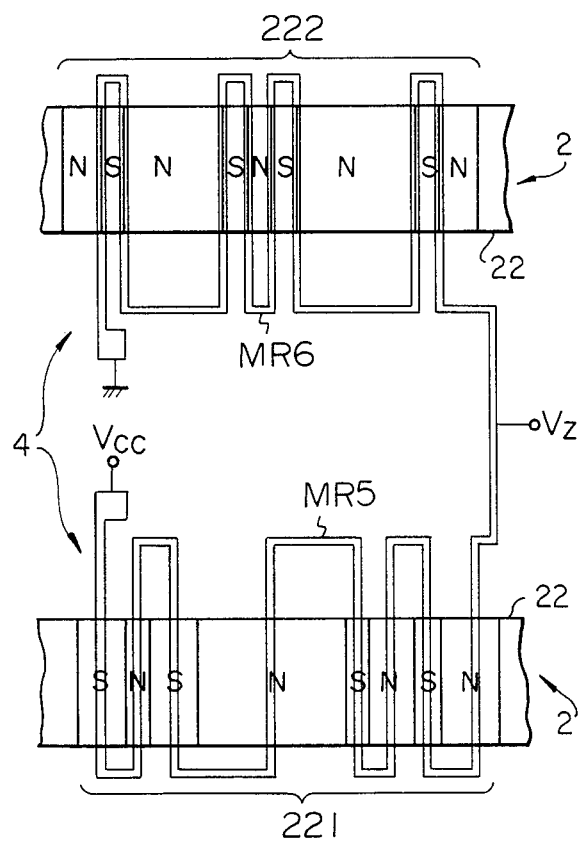
FIGS. 10 and 11 are diagrams illustrating second and third embodiments of the magnetic pattern and the magnetoresistance patterns for a Z-phase signal, according to the present invention.

In FIG. 8, it should be noted that the irregularity of the magnetic pattern 221 is independent of the irregularity of the magnetic pattern 222. In addition, in FIG. 8, the magnetic patterns 221 and 222 are adjacent to each other on a circumference of the rotating member 1. However, it is also possible to arrange the magnetic patterns 221 and 222 on different circumferences of the rotating member 1 as illustrated in FIG. 10, which is a second embodiment of the present invention.

Figure 11:
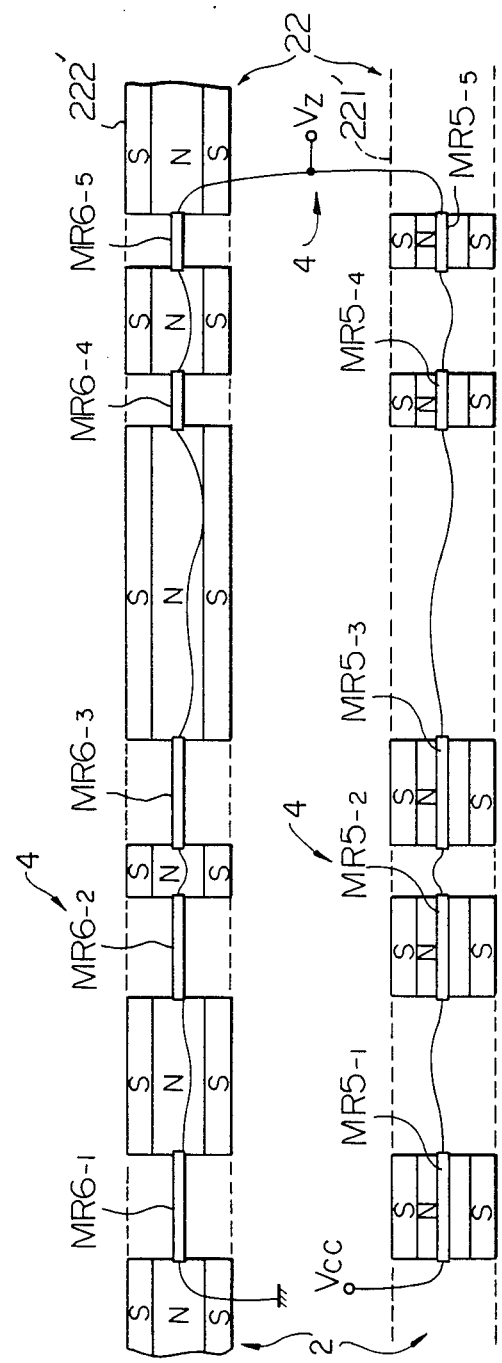

In FIG. 11, which illustrates a third embodiment of the present invention, the magnetic pattern 22 is constructed by a first pattern 221' and a second pattern 222' in which combinations of N pole areas and S pole areas are irregularly (nonequidistantly) arranged. For example, one such combination comprises an N pole area and two S pole areas, in other words, at least one pair of N pole area and S pole area. Therefore, in this case, this combination serves as a strong magnetic field generating area, while an area in which no pole area is formed serves as a weak magnetic field generating area.

A first reluctance pattern corresponding to the first magnetic pattern 221' is constructed by magnetoresistance elements MR5-1 through MR5-5, while a second magnetoresistance pattern corresponding to the second magnetic pattern is constructed by magnetoresistance elements MR6-1 through MR6-5. Such magnetoresistance elements are connected by leads (wires) which are not influenced by magnetic fluxes. Also, in this case, when the first magnetoresistance pattern formed by MR5-1 through MR5-5 directly faces the first magnetic pattern 221', the second magnetoresistance pattern formed by MR6-1 through MR6-5 directly faces the second magnetic pattern 222'. In other words, when the first magnetoresistance pattern has a minimum resistance value, the second magnetoresistance pattern has a maximum resistance value. As a result, the output voltage $V_Z$ reaches a maximum peak.

When the rotating member 1 (FIG. 1) rotates to move the magnetic pattern 22, other peaks than the maximum peak are also generated at the voltage $V_Z$. However, also in this case, the levels of the other peaks are extremely small as compared with the level of the maximum peak due to the irregular arrangement of the magnetic pattern 22.

In the embodiment as illustrated in FIG. 11, the first magnetic pattern 221' and the second magnetic pattern 222' are formed in relation to each other. It should, however, be noted that the irregularity of the first magnetic pattern 221' can be independent of the irregularity of the second magnetic pattern 222'. In addition, the first magnetic pattern 221' and the second magnetic pattern 222' are formed on two different circumferences of the rotating member 1 (FIG. 1). The two patterns, however, can also be formed on the same circumference of the rotating member 1.

As explained hereinbefore, according to the present invention, the differences between the maximum peak and the other peaks at the output voltage $V_Z$ are enlarged due to the irregular arrangement of strong magnetic field generating areas and weak magnetic field generating areas. As a result, the maximum peak can be easily detected and detection errors of the reference position of the rotating member can be prevented.

We claim:

1. A pulse coder for generating a Z-phase signal for detecting a reference position of a rotating member, comprising:
    a fixed member;
    a rotating member rotatable with respect to said fixed member;
    first and second magnetic patterns formed on a circumference of said rotating member, each of said magnetic patterns having strong magnetic field generating areas and weak magnetic field generating areas arranged alternately, irregularly and nonequidistantly spaced on said circumference; and
    first and second magnetoresistance elements corresponding to said first and second magnetic patterns, respectively, formed on said fixed member, said first and second magnetoresistance elements being electrically connected in series with one another and operably connected to a Z-phase signal detection means,
said first and second magnetoresistance elements exhibiting a minimum resistance value and a maximum resistance value, respectively, when said first and second magnetic patterns of said rotating member are brought into directly facing relation with said first and second magnetoresistance elements, respectively, of said fixed member, such that when said magnetoresistance elements directly face said strong magnetic field generating areas of said magnetic patterns said magnetoresistance elements exhibit a minimum resistance value, and when directly facing said weak magnetic field generating areas of said magnetic patterns, said magnetoresistance elements exhibit a maximum resistance value, said reference position corresponding to a rotational position of said rotating member when one of said magnetoresistance elements is caused to exhibit a maximum resistance value and the other said magnetoresistance element is caused to exhibit a minimum resistance value such that the difference in resistance value between said respective first and second magnetoresistance elements is at a maximum.

2. A pulse coder as set forth in claim 1, wherein said first and second magnetic patterns are formed on the same circumference of said rotating member.

3. A pulse coder as set forth in claim 1, wherein said first and second magnetic patterns are formed on different circumferences of said rotating member.

4. A pulse coder as set forth in claim 1, wherein each of said strong magnetic field generating areas is formed by an N pole area or an S pole area and each of said weak magnetic field generating areas is formed by a radial boundary area between said N pole area and said S pole area.

5. A pulse coder as set forth in claim 1, wherein each of said strong magnetic field generating areas is formed by at least one pair of an N pole area and an S pole area and each of said weak magnetic field generating areas is formed by an area in which no pole area is formed.

6. A pulse coder as set forth in claim 1, wherein the irregularity of said first magnetic pattern is different from that of said second magnetic pattern.

\* \* \* \* \*